United States Patent [19]

Nagahisa et al.

[11] Patent Number: 5,888,855
[45] Date of Patent: *Mar. 30, 1999

[54] METHOD OF MANUFACTURING ACTIVE MATRIX DISPLAY

[75] Inventors: Nobuya Nagahisa, Shiga-ken; Takaaki Kamimura; Kunio Matumura, both of Himeji; Takayoshi Dohi, Hyogo-ken, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 572,334

[22] Filed: Dec. 14, 1995

[30] Foreign Application Priority Data

Dec. 14, 1994 [JP] Japan .................................. 6-310113

[51] Int. Cl.⁶ ................................................... H01L 21/84
[52] U.S. Cl. ........................................... 438/158; 438/786
[58] Field of Search ................................ 437/21, 40 TFI, 437/41 TFI, 101, 239–242; 438/158, 769, 770, 786, 762, 763

[56] References Cited

U.S. PATENT DOCUMENTS 5,091,337  2/1992  Watanabe et al. ....................... 437/181
5,258,333  11/1993  Shappir et al. ........................ 437/241

FOREIGN PATENT DOCUMENTS 60-45066   3/1985  Japan ................. 437/40 TFI
63-137479  6/1988  Japan .
1-184928   7/1989  Japan .
1-227127   9/1989  Japan .
3-209777   9/1991  Japan .
5-275702   10/1993 Japan .
6-132536   5/1994  Japan .

OTHER PUBLICATIONS

Translation of JP 6–132536, May 1994.
T.–S. Jen et al., Jpn.J.Appl.Phys., 33(7B)(1994) L 977, "Effects of N2O–Plasma treatment of SiON/ SiN gate insulators on . . . TFTs", Jul. 1994.

Primary Examiner—Chandra Chaudhari
Attorney, Agent, or Firm—Pillsbury Madison & Sutro LLP

[57] ABSTRACT

The present invention has a semiconductor device including a substrate made of an insulating material, a gate electrode formed on the substrate, a thin film made of a silicon semiconductor and formed on the gate electrode through a gate insulating film, a protective film formed on the thin film and having two opposing major surfaces, and a source electrode and a drain electrode formed to be electrically connected with the thin film, wherein the first major surface of the two major surfaces of the protective film is in contact with the thin film, and a region near the second major surface of the protective film contains oxygen. The present invention has a method of manufacturing a semiconductor device, in which a gate electrode is on a substrate made of an insulating material, a thin film made of a silicon semiconductor is formed on the gate electrode through a gate insulating film, a protective film having two opposing major surfaces in which a first major surface is in contact with the thin film and a region near a second major surface contains oxygen is formed on the thin film, and a source electrode and a drain electrode are formed to electrically connect with the thin film.

19 Claims, 5 Drawing Sheets

METHOD OF MANUFACTURING ACTIVE MATRIX DISPLAY

BACKGROUND OF THE INVENTION

1. Field of the Invention

The present invention relates to a semiconductor device effectively used for a pixel switch or a drive circuit of an active-matrix display device and a method of manufacturing the semiconductor device.

2. Description of the Related Art

A conventional semiconductor device having an active layer made of silicon semiconductor such as amorphous silicon (to be referred to as a-Si:H hereinafter), microcrystalline silicon, polycrystalline silicon (to be referred to as p-Si hereinafter), single crystalline silicon, or the like can be uniformly formed on an insulating surface with a relatively large area. For this reason, the semiconductor device is used for a pixel switch or a drive circuit of an active-matrix display device.

Figure 1:
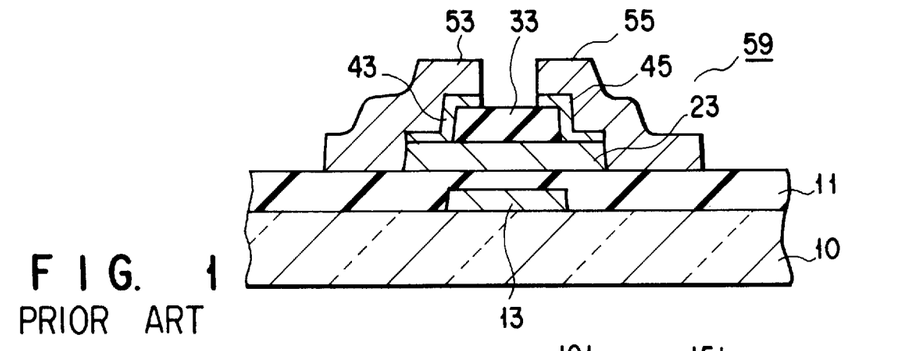
FIG. 1 is a sectional view showing part of a conventional semiconductor device.

FIG. 1 is a schematic sectional view showing a general thin-film transistor (to be referred to as a TFT hereinafter) used as a pixel switch of an active-matrix display device. The TFT will be briefly described below with reference to FIG. 1.

A TFT 59 is mainly constituted by a transparent insulating substrate 10 such as a glass substrate or a quartz substrate, a gate electrode 13 formed on the transparent insulating substrate 10, a gate insulating film 11 formed on the gate electrode 13, a silicon semiconductor silicon thin film 23 made of a-Si:H, p-Si, or the like and formed on the gate electrode 13 through the gate insulating film 11, a channel protective film 33 formed on the silicon semiconductor thin film 23, source and drain electrodes 55 and 53 electrically connected to the silicon semiconductor thin film 23, and low-resistance semiconductor films 43 and 45 formed to obtain preferable ohmic contacts between the silicon semiconductor thin film 23 and the source electrode 55 and between the silicon semiconductor thin film 23 and the drain electrode 53.

Since parasitic capacitances such as a gate-source capacitance (Cgs) formed between the gate electrode 13 and the drain electrode 53 and a gate-drain capacitance (Cgd) formed between the gate electrode 13 and the drain electrode 53 adversely affects the operation of the TFT 59, it is known that especially the channel protective film 33 is formed to be self-aligned to the gate electrode 13. More specifically, a photoresist film is formed on the channel protective film 33, the photoresist film is subjected to back exposure from the transparent insulating substrate 10 side by using the gate electrode 13 as a mask, and the resultant photoresist film is developed to leave the photoresist film in only an area in which the channel protective film 33 is to be formed. The resultant structure is patterned using the photoresist as a mask to form the channel protective film 33. In this manner, since the channel protective film 33 is self-aligned to the gate electrode 13, a channel protective film 33 is formed between the gate electrode 13 and the source electrode 55 or the drain electrode 53. Therefore, the parasitic capacitances such as the gate-source capacitance (Cgs) or the gate-drain capacitance (Cgd) can be decreased in magnitude in a channel region.

In the TFT 59, a silicon nitride ($SiN_x$) film or the like is generally used as the channel protective film 33. This is because the silicon nitride film does not adversely affect the interface between the silicon nitride film and the silicon semiconductor thin film 23 and can also be easily patterned. However, the channel protective film constituted by the silicon nitride film does not have good adhesion to the photoresist film for patterning the channel protective film. For this reason, the resist film may peel from the channel protective film during manufacture, and the channel protective film 33 may not be preferably patterned. Therefore, the following adverse effects occur. That is, the gate-source capacitance (Cgs) or gate-drain capacitance (Cgd) of the TFT 59 increases in magnitude, or the gate-source capacitances (Cgs) or gate-drain capacitances (Cgd) of respective TFTs 59 vary.

SUMMARY OF THE INVENTION

The present invention has been made in consideration of the above circumstances, and has as its object a semiconductor device having a small variation of characteristics in each element and a method of manufacturing the semiconductor device at a high yield.

The present invention provides a semiconductor device comprising a substrate made of an insulating material, a gate electrode formed on the substrate, a thin film made of a silicon semiconductor and formed on the gate electrode through a gate insulating film, a protective film formed on the thin film and having two opposing major surfaces, and a source electrode and a drain electrode formed to be electrically connected with the thin film, wherein the first major surface of the two major surfaces of the channel protective film is in contact with the thin film, and a region near the second major surface of the channel protective film contains oxygen.

In the device according to the present invention, it is preferable that a region near the first major surface of the protective film does not substantially contain oxygen. The protective film preferably includes a silicon nitride layer and an oxygen-containing silicon nitride layer, a first major surface is preferably constituted by the silicon nitride layer, and a second major surface is preferably constituted by the oxygen-containing silicon nitride layer.

In the device according to the present invention, the protective film is preferably constituted by a silicon nitride layer, and the region near the second major surface is preferably denatured by oxygen.

In a device according to the present invention, it is preferable that the region near the second major surface is a region having a depth of not more than about 300 Å from the second major surface.

The present invention provides a method of manufacturing a semiconductor device, comprising the steps of forming a gate electrode on a substrate made of an insulating material, forming a thin film made of silicon semiconductor on the gate electrode through a gate insulating film, forming a protective film, having two opposing major surfaces in which a first major surface is in contact with the thin film and a region near a second major surface contains oxygen, on the thin film, and forming a source electrode and a drain electrode to electrically connect with the thin film.

In a method according to the present invention, the step of forming a protective film on the thin film preferably comprises the step of forming a first insulating film on the thin film, the step of forming a second insulating film containing oxygen on the first insulating film, and the step of patterning the first and second insulating films. The step of forming a protective film on the thin film also preferably comprises the step of forming an insulating film on the thin film, the step of subjecting a surface of the insulating film to an oxidizing treatment, and the step of patterning the insulating film. Note that the oxidizing treatment is substantially continuously performed after forming the insulating film on the thin film without exposing the insulating film to atmospheric air. In addition, $N_2O$ gas is preferably used in the oxidizing treatment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

According to the present invention, since a region near one major surface (major surface which is in contact with a resist film) of the two major surfaces of a protective film contains oxygen, the adhesion between the protective film and a resist film made of a photosensitive resin composition such as a positive (posi-type) resist (a cresol-novolak-based resin) or a negative (nega-type) resist and used in patterning of the protective film, is improved. For this reason, the protective film can be normally and uniformly patterned, the manufacturing yield increases, thereby manufacturing a semiconductor device having desirable characteristics without a variation of characteristics in each element.

In the present invention, the region near the major surface means a region having a depth of about 10 Å from the major surface of the protective film. An oxygen content in the region near one major surface of the protective film is preferably set to be 50 atomic % or more to obtain a satisfactory adhesion with the resist film. When the protective film made of oxygen-containing silicon nitride (silicon oxynitride) represented by SiNxOy, a stoichiometric coefficient of oxygen y is desirably set to be 1 or more.

Considering only the adhesion between the protective film and the resist film, the protective film may be made of an oxide such as silicon oxide ($SiO_2$). However, when the protective film is made of silicon oxide ($SiO_2$), in the process of forming a silicon oxide ($SiO_2$) film, interfacial levels caused by oxygen are formed on the interface between the silicon oxide film and a silicon semiconductor film to degrade the characteristics of the element.

For this reason, the protective film is constituted as follows. That is, the first major surface of the two major surfaces of the protective film is in contact with the silicon semiconductor thin film, and the region near the second major surface contains oxygen. Note that, in this specification, the film which does not substantially contain oxygen means a film having an oxygen concentration of less than about $2 \times 10^{19}$ atomic/cc.

Such a protective film can be formed by a method of stacking a layer which does not substantially contain oxygen, and a layer containing oxygen sequentially both the layers, and a method of forming a layer which does not substantially contain oxygen and then causing oxygen to denature the surface of the layer. Note that, when the surface is denatured by oxygen, an $N_2O$ gas atmosphere or an $O_2$ gas atmosphere is preferably used. As a treatment method, a method of producing a plasma state by using the energy of a direct current, a high frequency or microwave, and a method of producing a radical by using a photo-energy may be used.

As the oxygen-containing region (region near the major surface) of the protective film, a thin region is desirably used in consideration of the patterning properties of the protective film or disconnection of a source electrode or a drain electrode caused by an overhanging phenomenon. In particular, the thickness of the region is preferably set to be within the range of from 10–500 Å, more preferably 30–300Å.

The region which does not substantially contain oxygen preferably is made of silicon nitride, especially, $SiN_x$ having a stoichiometric ratio of Si:N=1:x (x=1.0–2.0), in consideration of the etching processability of the region. In manufacture of an array substrate for an active-matrix display device or the like, it is necessary that selectivity between the etching rates of the protective film and a gate insulating film is assured. For this reason, the gate insulating film is preferably constituted by an insulating film made of a material different from silicon nitride or $SiN_x$, for example, an insulating film containing silicon oxide ($SiO_2$).

When the layer of the protective film which does not substantially contain oxygen is made of silicon nitride or $SiN_x$, if the layer containing oxygen made of oxygen-containing silicon nitride ($SiN_xO_y$), the layers can be substantially continuously formed in a state which maintain vacuum during film formation or denaturation. For this reason, the semiconductor device can be manufactured without degrading productivity. In this case, when the region near the major surface is denatured by oxygen, even if an $N_2O$ gas plasma is used, the film formation can be continuously performed in the same reaction chamber. For this reason, the semiconductor device can be manufactured without degrading productivity.

A method of manufacturing a semiconductor device according to an embodiment of the present invention will be described below by using an active-matrix display device array substrate with reference to the accompanying drawings.

Figure 2:
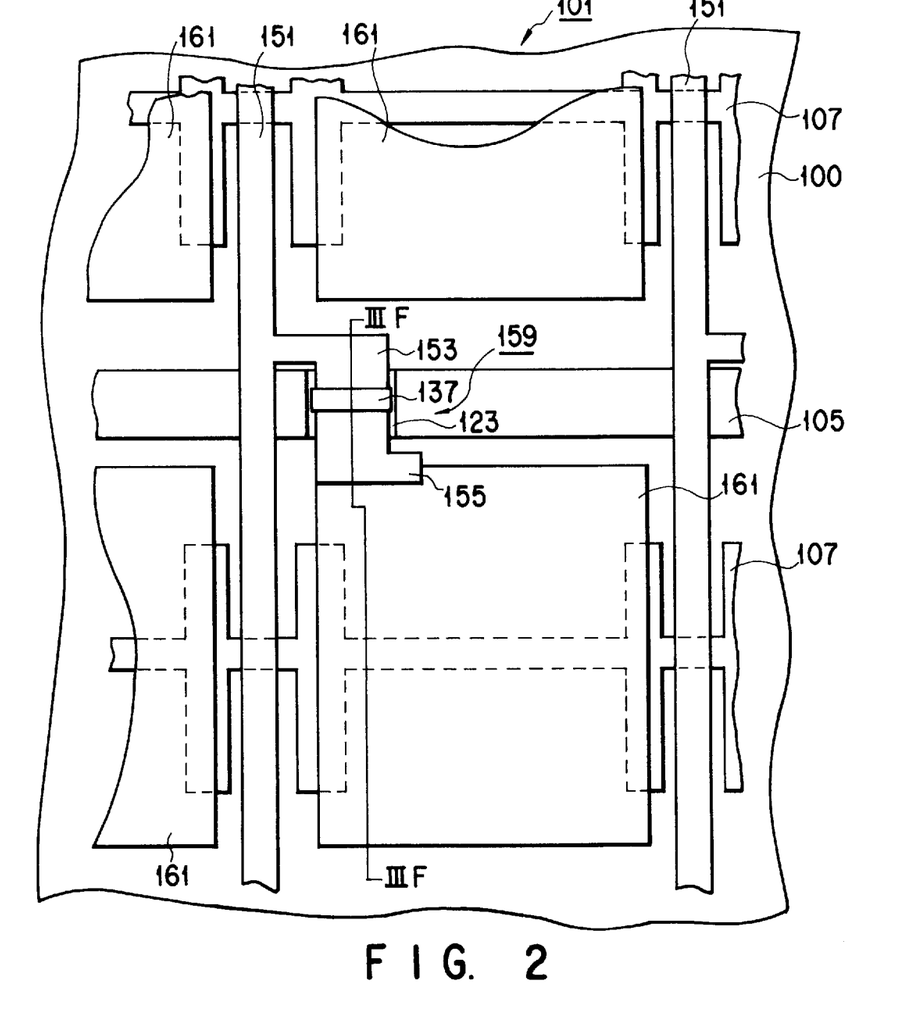
FIGS. 2 and 6 are front views showing part of a semiconductor device according to the present invention.

FIG. 2 is a plan view showing part of an active-matrix display device array substrate, and FIGS. 3A to 3F are sectional views showing the active-matrix display device array substrate along a IIIF—IIIF line in FIG. 2, and are for explaining manufacturing processes.

In this active-matrix display device array substrate 101, a plurality of signal lines 151 made of aluminum (Al) and a plurality of scanning lines 105 made of an Mo—Ta alloy film and perpendicular to the signal lines 151 are arranged in the form of a matrix, and transparent pixel electrodes 161 made of ITO (Indium Tin Oxide) are arranged in regions surrounded by the signal lines 151 and the scanning lines 105. A TFT 159 having an inverted staggered structure using the scanning line 105 itself as a gate electrode 103 (see FIG. 3F) is arranged at a node portion of each signal line 151 and each scanning line 105.

Figure 3A:
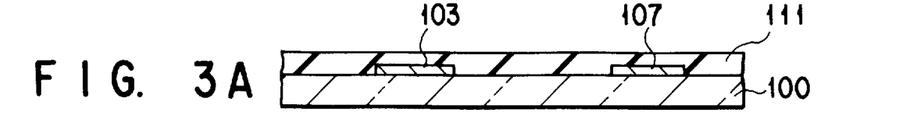
FIGS. 3A to 3F are sectional views for explaining the processes in manufacturing the semiconductor device shown in FIG. 2.
Figure 3B:
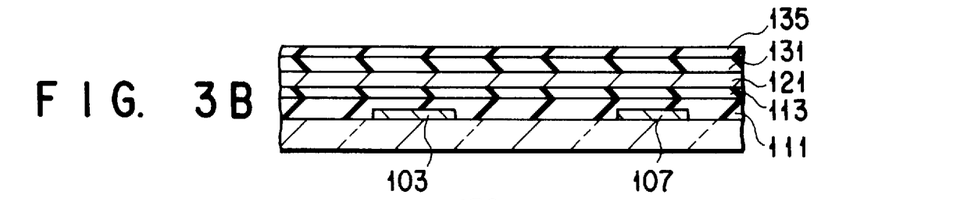
Figure 3C:
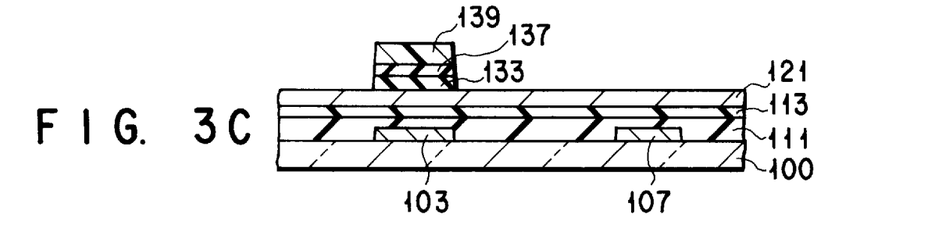
Figure 3D:
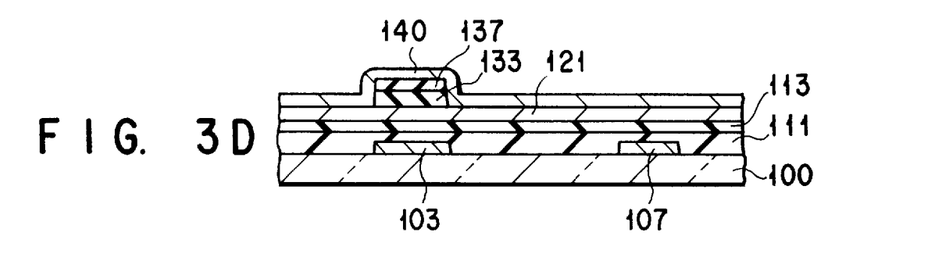
Figure 3E:
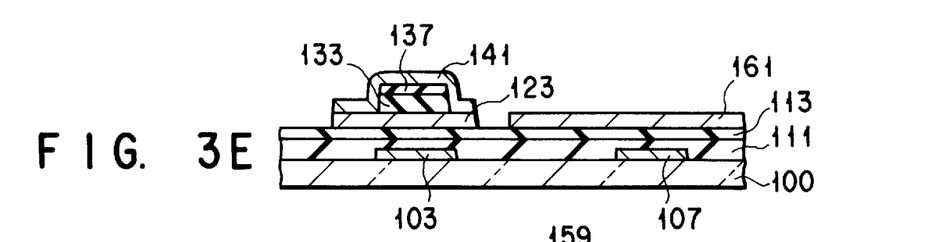
Figure 3F:
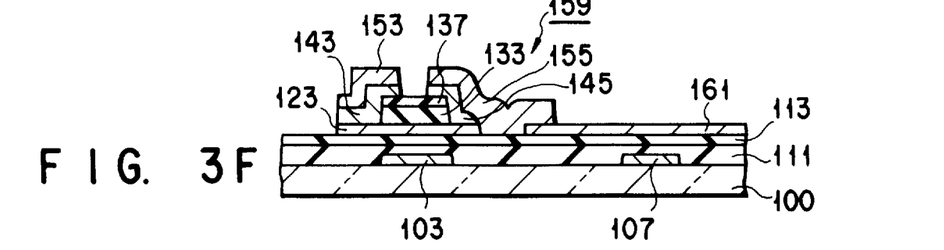

The TFT 159, as shown in FIG. 3F, mainly comprises a first gate insulating film 111 made of an oxygen-containing silicon nitride (SiON) film formed on the gate electrode 103, a second gate insulating film 113 made of a silicon nitride ($SN_x$) film, a semiconductor thin film 123 constituted by an a-Si:H thin film arranged on the first gate insulating film 111 and the second gate insulating film 113, first and second channel protective films 133 and 137 self-aligned to the gate electrode 103 on the semiconductor thin film 123, a source electrode 155 electrically connected to the semiconductor thin film 123 through low-resistance semiconductor films 143 and 145, and a drain electrode 153 integrated with the signal line 151.

The first channel protective film 133 is an $SiN_x$ film having a thickness of 3,000 Å, and the second channel protective film 137 is an oxygen containing silicon nitride ($SiN_xO_y$) film having a thickness of 100 Å. In this case, the first channel protective film 133 has the first major surface, and the second channel protective film 137 has the second major surface.

The active-matrix display device array substrate 101 comprises a storage capacitor line 107 which is arranged on the transparent glass substrate 100 almost parallel to the scanning line 105 and is made of the same material as that of the scanning line 105, i.e., an Mo—Ta alloy. A storage capacitor (Cs) is formed between the storage capacitor line 107 and the pixel electrode 161 arranged on the active-matrix display device array substrate 101 through the first and second gate insulating films 111 and 113.

A method of manufacturing the active-matrix display device array substrate 101 will be described below with reference to FIGS. 3A to 3F.

As shown in FIG. 3A, an Mo—Ta alloy film is formed on the surface of the glass substrate 100 by sputtering, and the Mo—Ta alloy film is patterned in the form of a plurality of stripes to form the storage capacitor line 107 and the scanning line 105 (see FIG. 2) partially constituting the gate electrode 103. Film formation is performed by CVD (Chemical Vapor Deposition).

Figure 4:
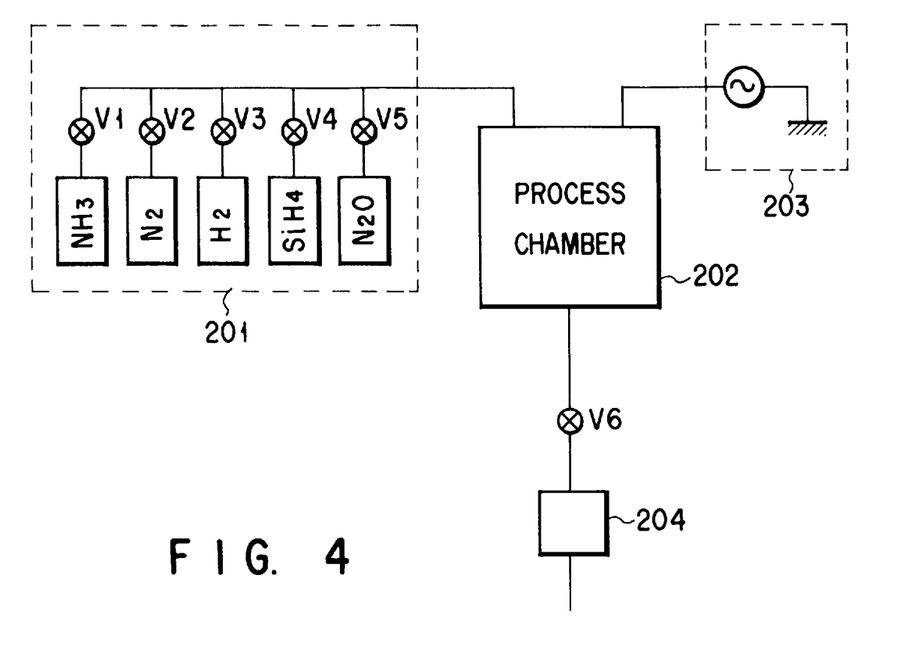
FIG. 4 is a schematic view showing a thin-film formation apparatus used in a method of manufacturing a semiconductor device according to the present invention.
Figure 5:
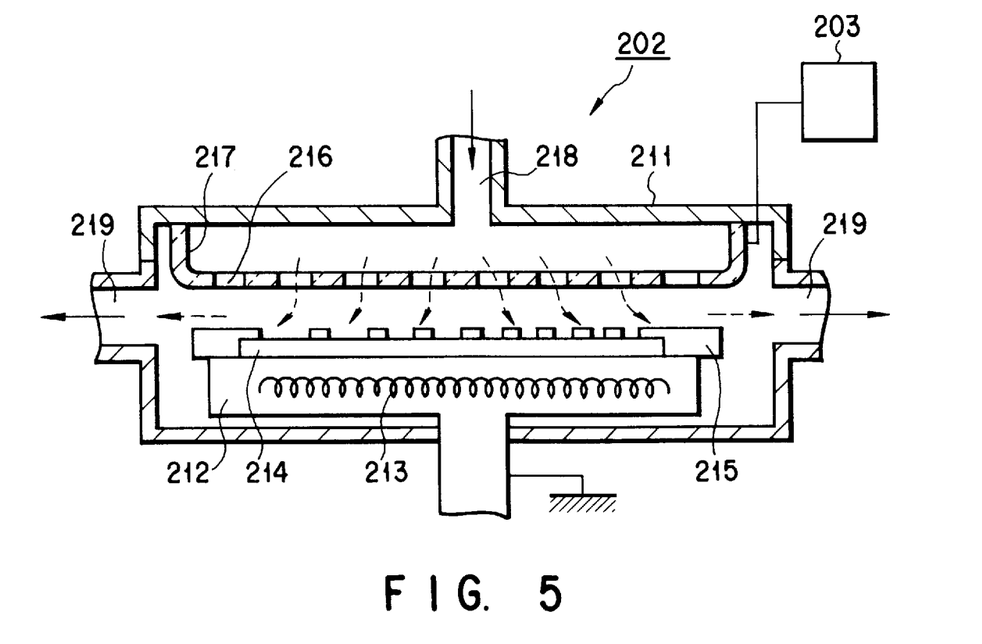
FIG. 5 is a view for explaining part of the apparatus shown in FIG. 4.

FIGS. 4 and 5 are views showing a thin film forming apparatus (CVD apparatus) used in this manufacturing method. This thin film forming apparatus, as shown in FIG. 4, mainly comprises a gas supply unit 201, a process chamber 202, a power supply unit 203, and an exhausting means 204, for example a vacuum pump. The gas supply unit 201 is designed to supply an $NH_3$ gas, an $N_2$ gas, an $H_2$ gas, an $SiH_4$ gas, and an $N_2O$ gas to the process chamber 202 through valve $V_1$ to $V_5$, respectively. The power supply unit 203 is designed to supply a high-frequency power or the like to the process chamber 202, and exhausting means 204 is used to exhaust a gas processed in the process chamber 202 through the valve $V_6$.

The process chamber 202 is constituted as shown in FIG. 5. Reference numeral 211 in FIG. 5 denotes a reaction chamber. A susceptor 212 is arranged in the reaction chamber 211. A heater 213 is incorporated in the susceptor 212 to elevate the temperature of an object 214 to be processed placed on the susceptor 212 to a predetermined temperature. A fixture 215 for fixing the object 214 is arranged on the susceptor 212.

An electrode 217 having a gas supply hole 216 is arranged above the object 214, and the electrode 217 is electrically connected to the power supply unit 203. A gas supply pipe 218 communicating with the gas supply unit 201 is formed in the top portion of the reaction chamber 211, a gas supplied from the gas supply unit 201 passes through the gas supply pipe 218, flows into the reaction chamber 211 through the gas supply unit 216, and brought into contact with the object 214. The processed gas is supplied to the exhausting means 204 through an exhaust pipe 219 arranged in a side wall of the reaction chamber 211.

The thin film forming apparatus having the above arrangement is used to form an oxygen containing silicon nitride film (SiON) having a thickness of 3,500 Å as the first gate insulating film 111 on the gate electrode 103 and the storage capacitor line 107. At this time, film formation is performed under the following conditions. That is, a silane ($SiH_4$) gas, a dinitrogen monoxide ($N_2O$) gas, and a nitrogen gas ($N_2$) are supplied into the reaction chamber 211 at flow rates of 200 sccm, 1,200 sccm, and 4,000 scam, respectively, the pressure in the reaction chamber is kept at 1.2 Torr, and a high-frequency power of 1,300 W is supplied to the electrode 217.

The glass substrate 100 on which the gate electrode 103, the scanning line 105, the storage capacitor line 107, and the first gate insulating film 111 are arranged is placed on the susceptor 212 of the reaction chamber 211, and an $SiH_4$ gas, an ammonia ($NH_3$) gas, and an $N_2$ gas are supplied into the reaction chamber as reaction gases at flow rates of 200 scam, 1,000 scam, and 7,000 sccm, respectively. The pressure in the reaction chamber is kept at 1.2 Torr, and the glass substrate is heated by the heater 213 to have a temperature of 330° C. A high-frequency power of 1,300 W is supplied from the power supply unit 203 to plasma-excite the $SiH_4$ gas and $NH_3$ gas, thereby forming an $SiN_x$ film having a thickness of 500 Å as the second gate insulating film 113.

An $SiH_4$ gas and a hydrogen ($H_2$) gas are supplied into the reaction chamber at flow rates of 500 sccm and 2,800 sccm in place of the above reaction gases, respectively, and the pressure in the reaction chamber is kept at 3.0 Torr. The temperature of the glass substrate is controlled to be 330° C., and a high-frequency power of 150 W is supplied, thereby forming an a-Si:H thin film 121 having a thickness of 500 Å on the second gate insulating film 113.

An $SiH_4$ gas and an $NH_3$ gas serving as reaction gases and an $N_2$ gas serving as a carrier gas are supplied into the reaction chamber at flow rates of 350 sccm, 2,800 sccm, and 3500 sccm, respectively, and the pressure in the reaction chamber is kept at 3.5 Torr. The temperature of the glass substrate is controlled to be 300° C., and a high-frequency power of 1,700 W is supplied, thereby forming an $SiN_x$ film 131 having a thickness of 3,000 Å.

An $SiH_4$ gas and an $NH_3$ gas serving as reaction gases and an $N_2$ gas serving as carrier gases, and an $N_2O$ gas are supplied into the reaction chamber at flow rates of 500 sccm, 2,500 sccm, 3,500 sccm, and 1,200 sccm, respectively, and the pressure in the reaction chamber is kept at 3.5 Torr. The temperature of the glass substrate is controlled to be 300° C., and a high-frequency power of 1,400 W is supplied, thereby forming an $SiN_xO_y$ film 135 having a thickness of 100 Å.

When the oxygen content of the $SiN_xO_y$ film 135 formed as described above was measured by XPS (X-ray Photoelectric Spectroscopy), the oxygen content is 50 atomic % or more, i.e., 53 atomic %. Although an oxygen atom was detected in a region having a depth of 100 Å from the surface (major surface) of the $SiN_xO_y$ film 135, an oxygen atom was not substantially detected in a region having a depth of more than 200 Å from the surface.

In this manner, as shown in FIG. 3B, four layers, i.e., the second gate insulating film 113 made of $SiN_x$, the a-Si:H thin film 121, the $SiN_x$ film 131, and the $SiN_xO_y$ film 135 are sequentially formed on the glass substrate 100 including a silicon oxide film as the first gate insulating film 111. Thereafter, the pressure in the reaction chamber is reduced, and the gases are exhausted by the exhausting means 204.

Thereafter, a photoresist containing a cresol-novolak-based resin as a main component is coated on the $SiN_xO_y$ film 135 by using a spin coater to form a resist film, and light is irradiated on the back (lower) surface of the glass substrate 100 using the gate electrode 103 as a mask, and light is irradiated on the front (upper) surface of the glass substrate 100 through a mask to expose the resist film. As shown in FIG. 3C, a resist film 139 in a region corresponding to the gate electrode 103 is left, and the $SiN_x$ film 131 and the $SiN_xO_y$ film 135 are patterned using the resist film 139 as a mask, thereby forming the first channel protective film 133 and the second channel protective film 137.

As shown in FIG. 3D, the resist film 139 on the first channel protective film 133 and the second channel protective film 137 is removed by a stripping liquid. The surface of the a-Si:H thin film 121 is washed in a dilute hydrofluoric acid solution, and an $n^+$-type a-Si:H thin film 140 is formed. Although this washing operation may entirely remove the second channel protective film 137 depending on the thickness of the second channel protective film 137, it does not matter whether the second channel protective film 137 is left or removed. However, the dielectric constant of the second channel protective film 137 is about 4, and is smaller than that of the first channel protective film 133 having a dielectric constant of about 6. For this reason, since a parasitic capacitance formed between the source or drain electrode and the gate electrode through the first channel protective film 133 and the second channel protective film 137 can be reduced, the second channel protective film 137 is preferably left.

Thereafter, as shown in FIG. 3E, the resultant structure is patterned to leave an $n^+$-type a-Si:H thin film 141 having an island-like shape, thereby forming the island-like $n^+$-type a-Si:H thin film 141 and the semiconductor thin film 123. An ITO film is formed on the resultant structure and patterned to form the pixel electrode 161.

Finally, as shown in FIG. 3F, aluminum is deposited on the resultant structure, and this aluminum film is patterned to form the source electrode 155 and the drain electrode 153, thereby manufacturing the active-matrix display device array substrate 101. Note that, in this case, the island-like $n^+$-type a-Si:H thin film 141 is patterned simultaneously with formation of the source electrode 155 and the drain electrode 153 to form low-resistance semiconductor films 143 and 145.

As described above, according to the TFT 159 of the active-matrix display device array substrate 101 of this embodiment, since the second channel protective film 137 is constituted on the basis of the $SiN_xO_y$ film 135 containing 53 atomic % of oxygen, the preferable adhesion between the second channel protective film 137 and the resist film can be assured. For this reason, the first channel protective film 133 and the second channel protective film 137 each having a desired shape can be formed. As a result, the parasitic capacitance of each TFT 159 can be sufficiently reduced, and each TFT 159 can be free from a variation of characteristics in each element.

In addition, since the thickness of the $SiN_xO_y$ film 135 constituting second channel protective film 137 is especially set to be 100 Å, the patterning properties of the second channel protective film 137 are not degraded. Furthermore, the first channel protective film 133 which is in contact with the semiconductor thin film 123 does not adversely affect the semiconductor thin film 123 and does not degrade the element characteristics because the oxygen content of a region near the semiconductor thin film 123 is $2 \times 10^{19}$ atomic/cc or less, i.e., $7 \times 10^{18}$ atomic/cc.

According to this embodiment, since the $SiN_x$ film 131 and the $SiN_xO_y$ film 135 which respectively constitute the first channel protective film 133 and the second channel protective film 137 are continuously formed in the same reaction chamber, productivity is not considerably degraded.

A method of manufacturing an active-matrix display device according to another embodiment of the present invention will be described below. Note that the same reference numerals as in the above embodiment denote the same parts in this embodiment.

Figure 6:
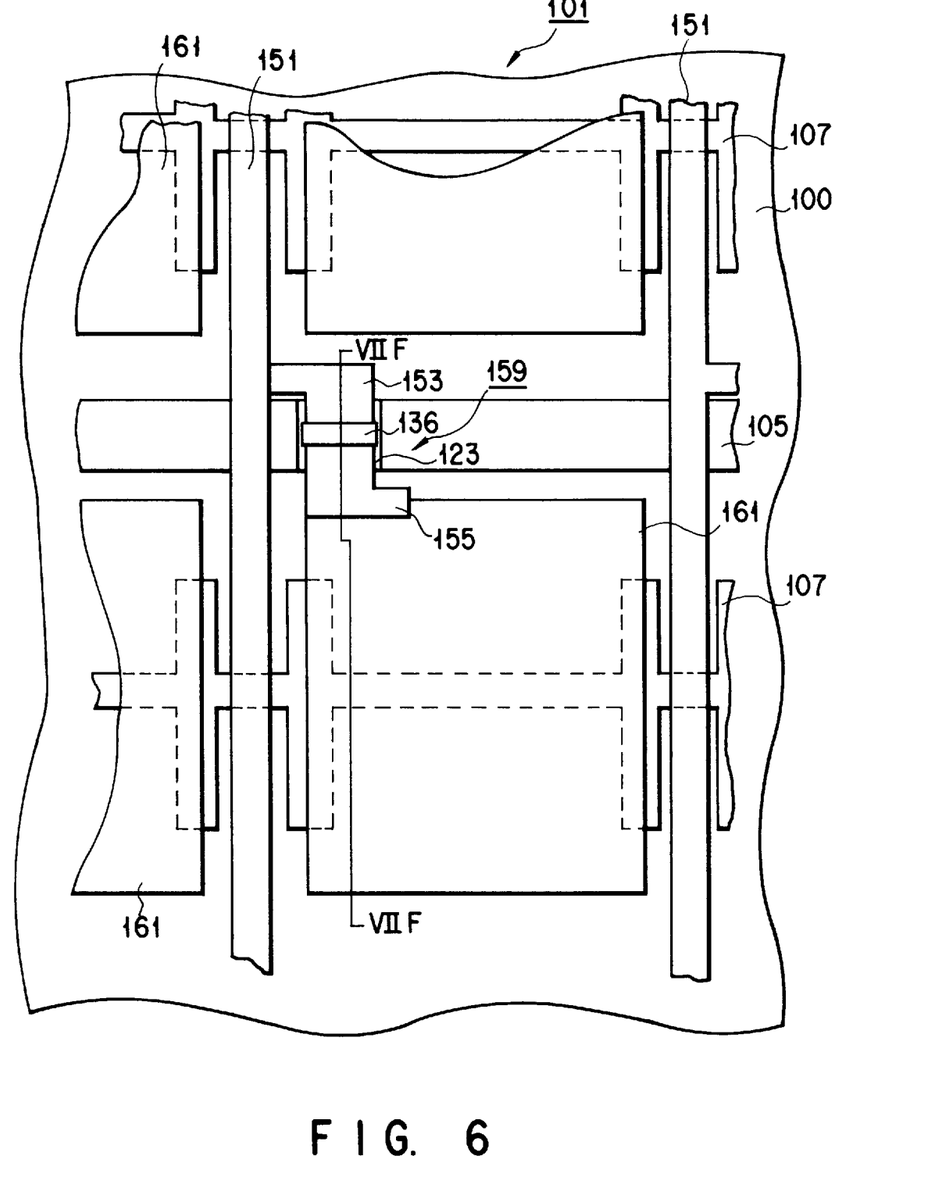

FIG. 6 is a front view showing part of an active-matrix display device array substrate, and FIGS. 7A to 7F are sectional views showing the active-matrix display device array substrate along a VIIF—VIIF line in FIG. 6, and are for explaining manufacturing processes.

In this active-matrix display device array substrate 101, a plurality of signal lines 151 made of aluminum (Al) and a plurality of scanning lines 105 constituted by an Mo—Ta alloy film and perpendicular to the signal lines 151 are arranged in the form of a matrix, and transparent pixel electrodes 161 made of ITO are arranged in regions surrounded by the signal lines 151 and the scanning lines 105. A TFT 159 having an inverted staggered structure using the scanning line 105 itself as a gate electrode 103 (see FIG. 7F) is arranged at a node portion of each signal line 151 and each scanning line 105.

Figure 7A:
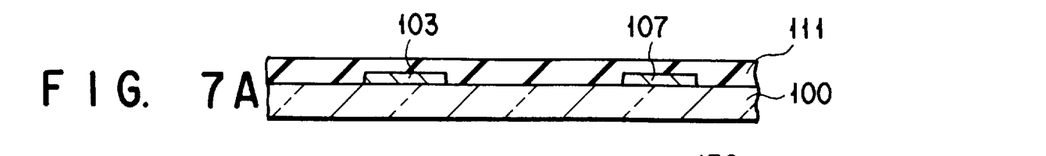
FIGS. 7A to 7F are sectional views for explaining the processes in manufacturing the semiconductor device shown in FIG. 6.
Figure 7B:
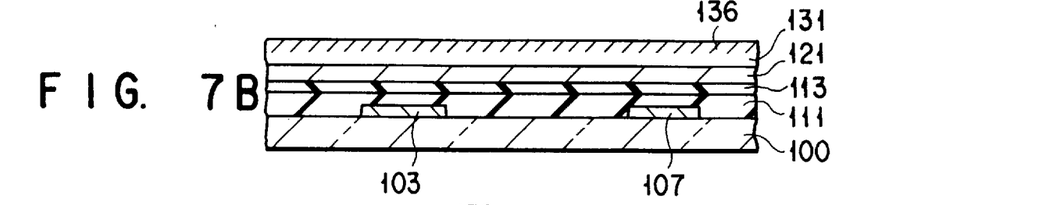
Figure 7C:
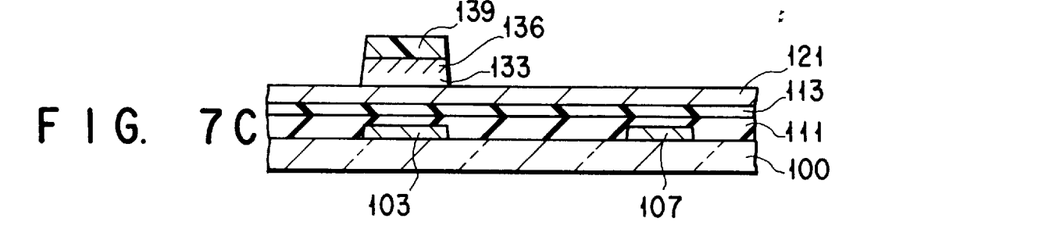
Figure 7D:
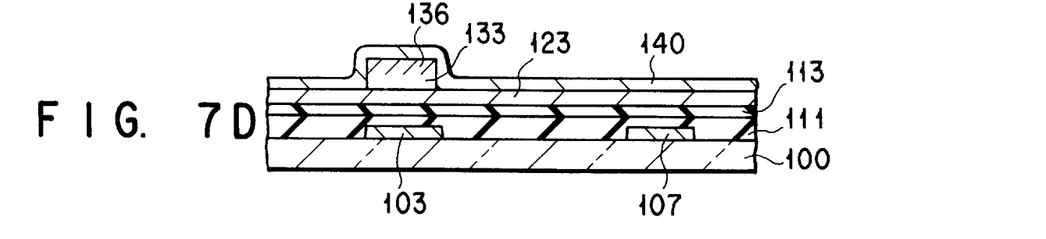
Figure 7E:
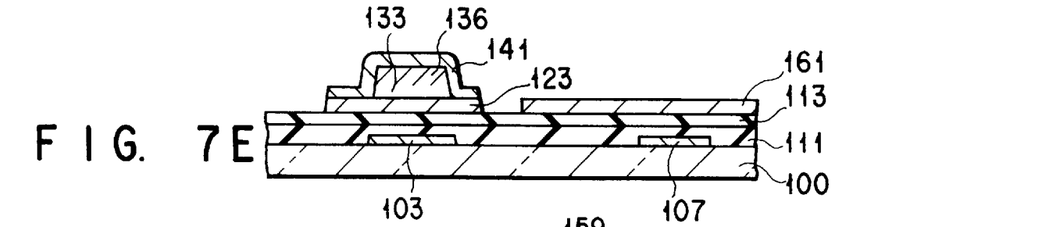
Figure 7F:
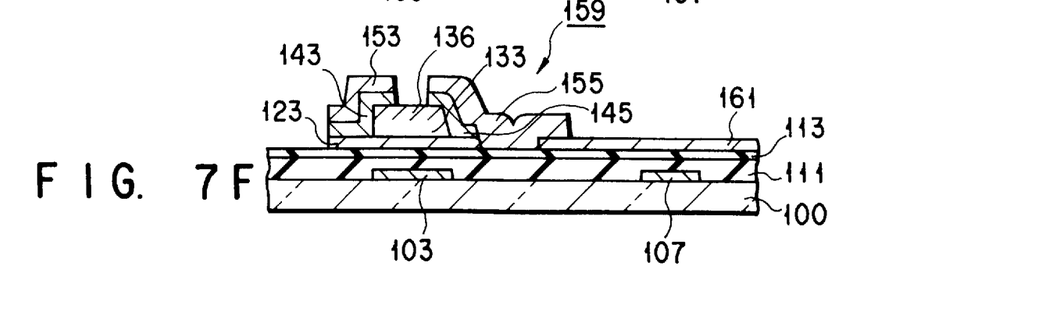

The TFT 159, as shown in FIG. 7F, mainly comprises a first gate insulating film 111 constituted by an SiON film formed on the gate electrode 103, a second gate insulating film 113 constituted by an $SiN_x$ film, a semiconductor thin film 123 constituted by an a-Si:H thin film arranged on the first gate insulating film 111 and the second gate insulating film 113, a channel protective film 133 self-aligned to the gate electrode 103 on the semiconductor thin film 123, a source electrode 155 electrically connected to the semiconductor thin film 123 through low-resistance semiconductor films 143 and 145, and a drain electrode 153 integrated with the signal line 151.

The channel protective film 133 is an $SiN_x$ film having a thickness of 3,000 Å, and its surface comprises an oxygen denaturation region 136 obtained by causing oxygen to denature the surface layer. The oxygen concentration of the oxygen denaturation region 136 gradually decreases from the uppermost surface of the channel protective film 133, and substantially contains oxygen in a depth of only about 100 Å.

The active-matrix display device array substrate 101 comprises a storage capacitor line 107 which is arranged on the transparent glass substrate 100 almost parallel to the scanning line 105 and made of the same material as that of the scanning line 105, i.e., an Mo—Ta alloy. A storage capacitor (Cs) is formed between the storage capacitor line 107 and the pixel electrode 161 arranged on the active-matrix display device array substrate 101 through the first and second gate insulating films 111 and 113.

A method of manufacturing the active-matrix display device array substrate 101 will be described below with reference to FIGS. 7A to 7F.

As shown in FIG. 7A, an Mo—Ta alloy film is formed on the surface of the glass substrate 100 by sputtering, and the Mo—Ta alloy film is patterned in the form of a plurality of stripes to form the storage capacitor line 107 and the scanning line 105 (see FIG. 2) partially constituting the gate electrode 103.

Film formation is performed by CVD. A thin film forming apparatus having the above arrangement is used to form an oxygen containing silicon nitride film (SiON) having a thickness of 3,500 Å as the first gate insulating film 111 on the gate electrode 103 and the storage capacitor line 107. At this time, film formation is performed under the following conditions. That is, a silane ($SiH_4$) gas, a dinitrogen monoxide ($N_2O$) gas, and a nitrogen gas ($N_2$) are supplied into the reaction chamber 211 at flow rates of 200 sccm, 1,200 sccm, and 4,000 sccm, respectively, a pressure in the reaction chamber is kept at 1.2 Torr, and a high-frequency power of 1,300 W is supplied to the electrode 217.

The glass substrate 100 on which the gate electrode 103, the scanning line 105, the storage capacitor line 107, and the first gate insulating film 111 are arranged is placed on the susceptor 212 of the reaction chamber 211, and an $SiH_4$ gas, an $NH_3$ gas, and an $N_2$ gas are supplied into the reaction chamber as reaction gases at flow rates of 200 sccm, 1,000 sccm, and 7,000 sccm, respectively. The pressure in the reaction chamber is kept at 1.2 Torr, and the glass substrate is heated by a heater 213 to have a temperature of 330° C. A high-frequency power of 1,300 W is supplied from a power supply unit 203 to plasma-excite the $SiH_4$ gas and $NH_3$ gas, thereby forming an $SiN_x$ film having a thickness of 500 Å as the second gate insulating film 113.

An $SiH_4$ gas and a hydrogen ($H_2$) gas are supplied into the reaction chamber at flow rates of 500 sccm and 2,800 sccm in place of the above reaction gases, respectively, and the pressure in the reaction chamber is kept at 3.0 Torr. The temperature of the glass substrate is controlled to be 300° C., and a high-frequency power of 150 W is supplied, thereby forming an a-Si:H thin film 121 having a thickness of 500 Å on the second gate insulating film 113.

An $SiH_4$ gas and an $NH_3$ gas serving as reaction gases and an $N_2$ gas serving as a carrier gas are supplied into the reaction chamber at flow rates of 350 sccm, 2,800 sccm, and 3500 sccm, respectively, and the pressure in the reaction chamber is kept at 3.5 Torr. The temperature of the glass substrate is controlled to be 300° C., and a high-frequency power of 1,700 W is supplied, thereby forming an $SiN_x$ film 131 having a thickness of 3,000 Å.

The distance between the glass substrate and the electrode is set to be 25 mm, and an $N_2O$ gas is supplied into the reaction chamber as a reaction gas at a flow rate of 1,000 sccm. This state is kept for 10 seconds. At the same time, the pressure in the reaction chamber is adjusted to 1.5 Torr. A high-frequency power of 1,300 W is supplied to the reaction chamber to generate $N_2O$ plasma, and this $N_2O$ plasma oxidizes the surface of the $SiN_x$ film 131, thereby forming an oxygen denaturation region 136 made of $SiN_xO_y$. Note that the oxidation time of the $SiN_x$ prospectively serving as the channel protective film is set to be 5 seconds or more, and the pressure in the reaction chamber is kept at 1.5 Torr.

When the oxygen content of the surface portion of the $SiN_x$ film 131 oxidized as described above was measured by XPS (X-ray Photoelectric Spectroscopy), the oxygen content is 50 atomic % or more, i.e., 53 atomic %. Although an oxygen atom was detected in a region having a depth of 100 Å from the surface (major surface) of the $SiN_x$ film 131, an oxygen atom was not substantially detected in a region having a depth of more than 200 Å from the surface.

In this manner, as shown in FIG. 7B, three layers, i.e., the second gate insulating film 113 made of $SiN_x$, the a-Si:H thin film 121, and the $SiN_x$ film 131 are sequentially formed on the glass substrate 100 including a silicon oxide film as the first gate insulating film 111, and the surface portion of the $SiN_x$ film 131 is oxidized by the $N_2O$ plasma to form the oxygen denaturation region 136. Thereafter, the pressure in the reaction chamber is reduced, and the gases are exhausted by an exhausting means 204.

Thereafter, a photoresist containing a cresol-novolak-based resin as a main component is coated on the oxygen denaturation region 136 by using a spin coater to form a resist film, and light is irradiated on the back surface of the glass substrate 100 using the gate electrode 103 as a mask, and light is irradiated on the front surface of the glass substrate 100 through a mask to expose the resist film. As shown in FIG. 7C, a resist film 139 in a region corresponding to the gate electrode 103 is left, and the $SiN_x$ film 131 is patterned using the resist film 139 as a mask, thereby the channel protective film 133.

As shown in FIG. 7D, the resist film 139 on the channel protective film 133 is removed by a stripping liquid. The surface of the a-Si:H thin film 121 is washed in a dilute hydrofluoric acid solution, and an $n^+$-type a-Si:H thin film 140 is formed. Although this washing operation may also etch the channel protective film 133 or may remove the oxygen denaturation region 136 according to circumstances, it does not matter whether the oxygen denaturation region 136 is left or removed.

Thereafter, as shown in FIG. 7E, the resultant structure is patterned to leave an $n^+$-type a-Si:H thin film 141 having an island-like shape, thereby forming the island-like $n^+$-type a-Si:H thin film 141 and the semiconductor thin film 123. An ITO film is formed on the resultant structure and patterned to form the pixel electrode 161.

Finally, as shown in FIG. 7F, molybdenum, aluminum, and molybdenum are deposited on the resultant structure, and these films are patterned to form the source electrode 155 and the drain electrode 153, thereby manufacturing the active-matrix display device array substrate 101. Note that, in this case, the island-like $n^+$-type a-Si:H thin film 141 is patterned simultaneously with formation of the source electrode 153 and the drain electrode 155 to form low-resistance semiconductor films 143 and 145.

As described above, according to the TFT 159 of the active-matrix display device array substrate 101 of this embodiment, since the surface portion of the $SiN_x$ film 131 comprises the oxygen denaturation region 136, the preferable adhesion between the $SiN_x$ film 131 and the resist film can be assured. For this reason, the channel protective film 133 having a desired shape can be formed. As a result, the parasitic capacitance of each TFT 159 can be sufficiently reduced, and each TFT 159 can be free from a variation of characteristics in each element.

In the active-matrix display device array substrate 101 of this embodiment, the oxygen denaturation region 136 is formed by causing oxygen to denature the surface portion of the $SiN_x$ film 131. This array substrate is equivalent to the active-matrix display device array substrate 101 of the above embodiment, and has an advantage that process control can be easily performed.

In addition, since the thickness of the oxygen transformation region 136 is especially set to be 100 Å, the patterning properties of the oxygen denaturation region 136 are not degraded. Furthermore, the channel protective film 133 which is in contact with the semiconductor thin film 123 does not adversely affect the semiconductor thin film 123 and does not degrade the element characteristics because the oxygen content of a region near the semiconductor thin film 123 is $2 \times 10^{19}$ atomic/cc or less, i.e., $7 \times 10^{18}$ atomic/cc.

According to this embodiment, since the oxygen denaturation region 136 and the $SiN_x$ film 131 constituting the channel protective film 133 are continuously formed in the same reaction chamber, productivity is not considerably degraded.

In this embodiment, although an $N_2O$ gas is used when the oxygen denaturation region 136 is formed, another gas such as $O_2$ gas may also be used.

The array substrate 101, manufactured in each of the above embodiments, and counter electrodes are arranged on the active-matrix display device array substrate 101 at a predetermined gap by using a spacer according to a conventional method. A liquid crystal composition is injected between the substrates, and the substrate end portions are sealed to manufacture a liquid crystal panel. A drive circuit board is electrically connected to this liquid crystal panel, and if necessary polarizing plates are arranged on the outer surfaces of the liquid crystal panel, thereby manufacturing a liquid crystal display device.

Each of the embodiments describes that a semiconductor device according to the present invention is used as a switching element for each display pixel. However, the semiconductor device according to the present invention may be applied to a drive circuit unit. In addition, although each embodiment describes that an a-Si:H thin film is used as a semiconductor thin film, another silicon semiconductor thin film such as a p-Si film may be used as the semiconductor thin film.

In each of the above embodiments, the low-resistance semiconductor films 143 and 145 are interposed between the semiconductor thin film 123 and the source electrode 155 and between the semiconductor thin film 123 and the drain electrode 153, respectively, to obtain an ohmic contact between the semiconductor thin film 123 and the source electrode 155 and an ohmic contact between the semiconductor thin film 123 and the drain electrode 153. However, impurity ions such as phosphorus (P) ions may be implanted by using the channel protective film 133 as a mask, thereby forming a source/drain region in the semiconductor thin film 123.

As has been described above, according to the present invention, since the uppermost surface of the protective film contains oxygen in patterning, the adhesion between the protective film and the resist film used to pattern the protective film is improved, and the protective film can be accurately patterned. Therefore, a semiconductor device which has desirable characteristics and is free from a variation of characteristics in each element can be obtained at a high yield.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a thin film made of a silicon semiconductor on a substrate made of an insulating material;

forming an insulating film made of a silicon nitride film on said thin film;

oxidizing a surface region of said insulating nitride film by using an $N_2O$ plasma treatment to form a protective film having two opposing major surfaces in which a first major surface is in contact with said thin film and a region near a second major surface contains oxygen; and patterning said protective film to a desirable shape, wherein the insulating film forming step and the oxidizing step are substantially performed continuously without exposing said insulating film to atmospheric air, said first major surface of said protective film has an oxygen concentration that is controlled to be less than $2 \times 10^{19}$ atomic/cc by controlling the $N_2O$ plasma treatment.

2. A method of manufacturing a semiconductor device, comprising the steps of:

forming a gate electrode on an insulating substrate;

forming a gate insulating film on said gate electrode;

forming a silicon thin film on said gate insulating film;

forming an insulating film made of a silicon nitride on said thin film;

exposing said insulating film to an $N_2O$ plasma treatment, thereby forming a protective thin film having a first region in contact with said thin film and a second region on said first region;

patterning said protective film to a desirable shape; and forming a source electrode and drain electrode to electrically connect with said thin film, wherein the insulating film forming step and the exposing step are substantially performed continuously without exposing said insulating film to atmospheric air, said first region of said protective film is made of silicon nitride, and said second region of said protective film has an oxygen concentration of 50 atomic % or more and a thickness ranging from 10 to 500 Å, said oxygen concentration and thickness being controlled by controlling the $N_2O$ plasma treatment.

3. A method according to claim 2, wherein said first region near said thin film does not substantially contain oxygen.

4. A method according to claim 2, wherein a thickness of said second region is not more than about 300Å.

5. A method of manufacturing a semiconductor device, comprising the steps of:

forming a gate electrode on an insulating substrate;

forming a gate insulating film on said gate electrode;

forming a silicon thin film on said gate insulating film;

forming an insulating film made of silicon nitride on said thin film;

oxidizing a surface region of said insulating film using an $N_2O$ plasma treatment thereby forming a silicon nitride region in contact with said thin film and an oxygen denaturation region in a surface region of said insulating film;

patterning said insulating film to desirable shape; and forming a source electrode and a drain electrode to electrically connect with said thin film, wherein the insulating film forming step and the oxidizing step are substantially performed continuously without exposing said insulating film to atmospheric air, and an oxygen concentration of said first major surface of said protective film is controlled to be less than $2\times10^{19}$ atomic/cc by controlling the $N_2O$ plasma treatment.

6. A method according to claim 5, wherein said silicon semiconductor is one selected from the group consisting of an amorphous silicon, micro-crystalline silicon, single crystalline silicon, and polycrystalline silicon.

7. A method according to claim 5, wherein said patterning step comprises patterning said insulating film by a self-aligned method using said gate electrode as a mask.

8. A method according to claim 5, wherein the silicon nitride region near the thin film does not substantially contain oxygen.

9. A method according to claim 5, wherein a depth of the oxygen denaturation region is not more than about 300 Å from the surface of the insulating film.

10. A method according to claim 1 wherein said second major surface of said protective film has an oxygen concentration of 50 atomic % or more.

11. A method according to claim 1, wherein the thin film forming step, the insulating film forming step and the oxidizing step are substantially performed continuously without exposing said substrate to atmospheric air.

12. A method according to claim 11, wherein each of the thin film and the insulating film is formed by chemical vapor deposition.

13. A method according to claim 12, wherein said silicon semiconductor is amorphous silicon.

14. A method according to claim 2, wherein the silicon thin film forming step, the insulating film forming step and the exposing step are substantially performed continuously without exposing said substrate to atmospheric air.

15. A method according to claim 14, wherein each of the silicon thin film and the insulating film is formed by chemical vapor deposition.

16. A method according to claim 15, wherein said silicon thin film is amorphous silicon.

17. A method according to claim 5, wherein the silicon thin film forming step, the insulating film forming step and the oxidizing step are substantially performed continuously without exposing said substrate to atmospheric air.

18. A method according to claim 17, wherein each of the silicon thin film and the insulating film is formed by chemical vapor deposition.

19. A method according to claim 6, wherein said silicon semiconductor is amorphous silicon.

* * * * *